(12) United States Patent
Liu

(10) Patent No.: US 7,196,013 B2
(45) Date of Patent: Mar. 27, 2007

(54) CAPPING LAYER FOR A SEMICONDUCTOR DEVICE AND A METHOD OF FABRICATION

(75) Inventor: Mark Y. Liu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 236 days.

(21) Appl. No.: 10/319,734

(22) Filed: Dec. 12, 2002

(65) Prior Publication Data

US 2004/0115935 A1 Jun. 17, 2004

(51) Int. Cl.
*H01L 21/302* (2006.01)
(52) U.S. Cl. ............... 438/697; 438/754; 438/756; 438/757
(58) Field of Classification Search ......... 438/692, 438/694, 697, 745, 756, 757, 754
See application file for complete search history.

(56) References Cited

U.S. PATENT DOCUMENTS

| | | | | |
|---|---|---|---|---|
| 5,268,330 A | * | 12/1993 | Givens et al. | 438/586 |
| 6,156,654 A | * | 12/2000 | Ho et al. | 438/683 |
| 6,368,915 B1 | * | 4/2002 | Montree et al. | 438/257 |
| 6,495,437 B1 | * | 12/2002 | Yu | 438/591 |
| 6,524,920 B1 | * | 2/2003 | Yu | 438/303 |
| 6,577,011 B1 | * | 6/2003 | Buchwalter et al. | 257/758 |
| 6,624,489 B2 | * | 9/2003 | Chong et al. | 257/413 |
| 2003/0151098 A1 | * | 8/2003 | Nishida et al. | 257/369 |

* cited by examiner

*Primary Examiner*—Nadine G. Norton
*Assistant Examiner*—Binh X. Tran
(74) *Attorney, Agent, or Firm*—Blakely, Sokoloff, Taylor & Zafman LLP

(57) ABSTRACT

Numerous embodiments of a method and apparatus for a capping layer are disclosed. In one embodiment, a method of forming a capping layer for a semiconductor device comprises forming one or more layers on at least a portion of the top surface of a semiconductor device, substantially planarizing at least one of the one or more layers, annealing at least a portion of the semiconductor device, and removing a substantial portion of the one or more layers, using one or more etching processes.

22 Claims, 2 Drawing Sheets

CAPPING LAYER FOR A SEMICONDUCTOR DEVICE AND A METHOD OF FABRICATION

BACKGROUND

As part of the fabrication process for semiconductor devices such as integrated circuits (ICs), devices residing on a wafer typically undergo a heat treating or thermal annealing process, which may follow formation of one or more gate structures and implantation or doping of the wafer, for example. Annealing may serve several purposes, including physical repair of the silicon lattice structure following doping, and activation of the dopant.

Laser annealing is one particular annealing process that may be utilized in the fabrication of semiconductor devices, and may provide rapid annealing of selected portions of a semiconductor device. Laser annealing may be performed using many different techniques, including pulsed and stepped laser annealing. Laser annealing provides heating of selected portions of a silicon wafer, rather than heating of the entire wafer to a uniform temperature as in alternative annealing methods.

Present state of the art annealing methods such as laser annealing may result in uneven heating or temperature non-uniformity of surfaces of a semiconductor device, due at least in part to varying topographies or topologies of a device that are created during the fabrication process, and the nature of laser light being somewhat pattern dependent. For example, the topography of a semiconductor device may vary across the surface of the device. A surface on top of a substrate, in an area between two gates, may be in a lower relative vertical position than a top surface of a gate, for example. Because the topography differs among these surface points, a laser used in an annealing process may be absorbed or reflected differently depending on the pattern of the surface being irradiated. This may result in uneven heating among these surface points, which may result, for example, in the production of undesirable physical characteristics in a semiconductor device. A need exists, therefore, of a method and apparatus of reducing these thermal effects.

BRIEF DESCRIPTION OF THE DRAWINGS

The subject matter regarded as embodiments of the claimed subject matter is particularly pointed out and distinctly claimed in the concluding portion of the specification. Embodiments of the claimed subject matter, however, both as to organization and method of operation, together with objects, features, and advantages thereof, may best be understood by reference to the following detailed description when read with the accompanying drawings in which:

DETAILED DESCRIPTION

Figure 1A:
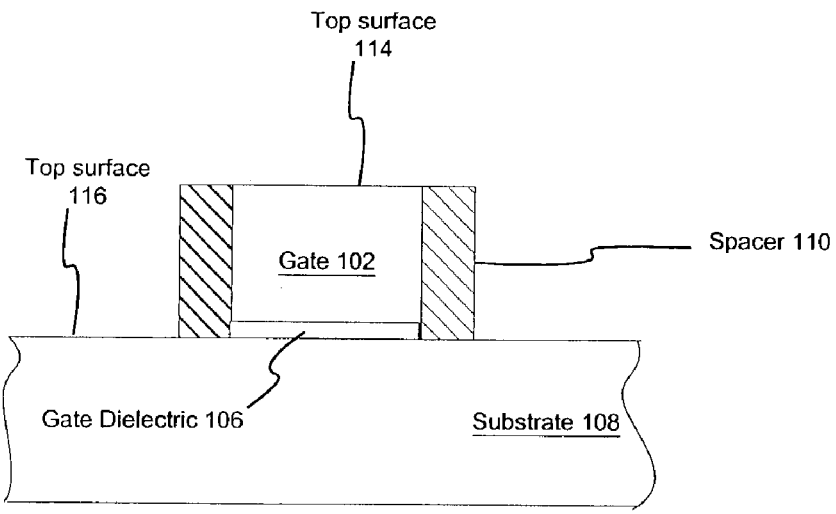
FIG. 1a is an illustration of a silicon substrate with devices formed thereon.

Embodiments of the claimed subject matter may comprise a capping layer for a semiconductor device and a method of fabrication. As mentioned previously, during fabrication of a device such as a semiconductor device, one or more fabrication processes may result in the production of a partially fabricated device with varying topologies and/or topographies. This may result in uneven heating of one or more areas of the device when undergoing heating processes such as laser annealing, due at least in part to these variations, and the tendency of laser light to be pattern dependent. More specifically, laser light tends to be coherent, meaning, for example, that the reflectivity of laser light may vary as light is exposed to devices of various patterns. In operation, and in the context of topography variation, surface points on a device that form a particular topography relative to other surface points on the device may be over-heated, due at least in part on the laser being absorbed more or reflected less than other areas. Overheating may result in the altering the material properties of a device and eventual formation of salicide, and/or softening of surface materials and/or sub-surface materials. Softening may lead to deformation of the semiconductor device surface, and may prevent or reduce the capacity to form abrupt junctions on the semiconductor device, as just an example.

Just as topography differs among surface points, topology may also differ among surface points. In this regard, a device substrate may include sections having different optical, chemical and/or electrical properties. For example, a substrate may include a substrate section, a source/drain region, and a gate oxide area, for example. Surface points on top of these materials may have a similar topography, but the topology differs, which affects how the surface points react to heat. Specifically, those surface points in respect of which the surface materials and/or sub-surface materials have relatively lower melting points may be over-heated, in comparison to surface points having a relatively higher melting point. Differences in the thermal conductivity of various materials can also result in an uneven heating of the surfaces, due at least in part to the different amounts of energy absorbed in different regions of the device. In this context, a semiconductor device may alternatively be referred to as a transistor or an integrated circuit (IC).

Embodiments of the claimed subject matter may comprise a capping layer for a semiconductor device, and a method of fabrication. The method may comprise forming a capping layer comprising a first and second layer, wherein the first layer is formed on at least a portion of the top surface of a semiconductor device, a second layer is formed on at least a portion of the first layer, and the second layer is substantially planarized prior to annealing at least a portion of the device.

It is worthy to note that any reference in the specification to "one embodiment" or "an embodiment" means that a particular feature, structure, or characteristic described in connection with the embodiment is included in at least one embodiment of the claimed subject matter. The appearances of the phrase "in one embodiment" in various places in the specification are not necessarily all referring to the same embodiment.

Numerous specific details may be set forth herein to provide a thorough understanding of the embodiments of the claimed subject matter. It will be understood by those skilled in the art, however, that the embodiments of the claimed subject matter may be practiced without these specific details. In other instances, well-known methods, procedures and components have not been described in detail so as not to obscure the embodiments of the claimed subject matter. It can be appreciated that the specific structural and functional details disclosed herein may be representative and do not necessarily limit the scope of the claimed subject matter.

Referring now in detail to the drawings wherein like parts are designated by like reference numerals throughout, there is illustrated in FIG. 1a a semiconductor device that may be configured to incorporate at least one embodiment of the claimed subject matter, and may comprise, for example, a partially formed metal oxide semiconductor (MOS) based transistor. Shown in FIG. 1a is a partially formed transistor for an integrated circuit. As is well-known, integrated circuits are usually manufactured on silicon or other semiconductor substrates. An integrated circuit may be comprised of millions of transistors such as partially formed transistor 100 of FIG. 1a. Devices such as partially formed transistor 100 typically include a substrate 108, which may comprise silicon, for example. A gate dielectric 106 is typically formed on the substrate, and may comprise silicon dioxide or other dielectric material, for example. Gate 102 is typically formed on the gate dielectric. Gate 102 is formed from an electrically conductive material, such as a metal or polysilicon based material, for example. Spacers 110 may be formed on the sides of the gate 102 and gate dielectric 106, and may be formed from a dielectric material. Spacers 110 may serve the purpose of separating the gate components from other components that will be formed proximate to the gate 102 during a later fabrication process, for example. One or more components such as source/drain regions (not shown) may be at least partially formed by doping and subsequent annealing. Embodiments of semiconductor devices such as transistors may vary, and the above-described device is provided for illustrative purposes. Fabrication of a semiconductor device such as partially formed transistor 100 is well known in the art, and may vary from the above-described method and still be in accordance with the claimed subject matter.

The topography of device 100 varies across the device. For example, the top surface 116 of substrate 108 is in a lower relative vertical position than the top surface 114 of gate 102. Because the topography differs among these top surfaces, methods of thermally treating devices such as device 100 may result in uneven heating among these surfaces. Just as topography differs among surfaces, topology may also differ among surfaces. Top surfaces 114 and 116 represent two surfaces having different topologies in respect of the surface materials and/or sub-surface materials used to form the structures embodying the top surfaces. Because the topology, including heat conduction characteristics of the underlying layers, may differ among these surfaces, methods of thermally treating devices such as device 100 may result in uneven heating among these surfaces, as described previously.

Figure 1B:
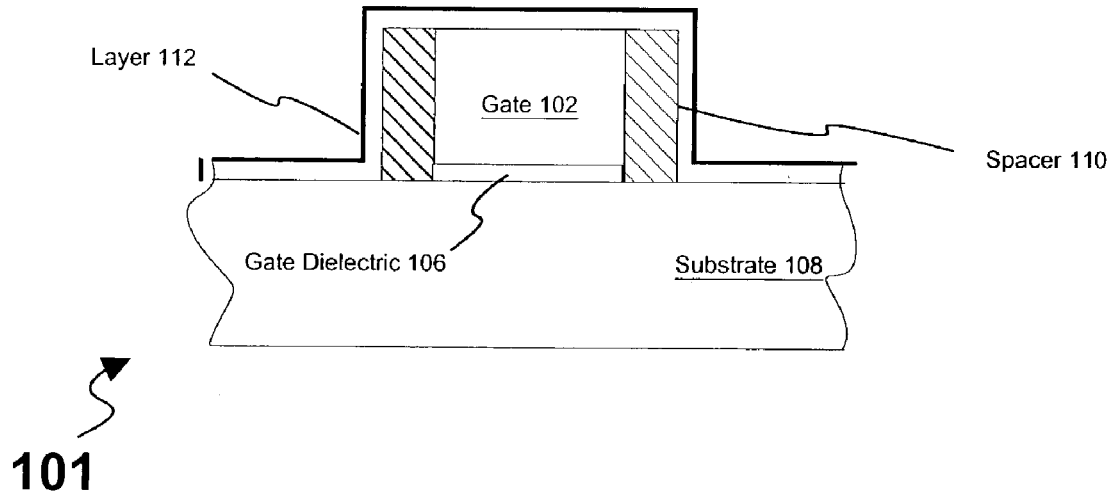
FIG. 1b is a illustration of a silicon substrate with devices formed thereon, wherein one or more devices has a layer formed thereon.

During the formation of a semiconductor device, and prior to a heat treating process such as annealing, a layer 112 may be formed or deposited on at least a portion of one or more top surfaces of a device such as partially formed transistor 101 of FIG. 1b. Layer 112 may be comprised of material that may have a higher melting point that one or more materials comprising device 101, such as a metal, for example. During a subsequent heat treating process, one or more components of a device that has a layer 112 formed or deposited thereon may begin to soften, but layer 112 may retain its shape and stiffness and may not soften, depending on the particular material used to form layer 112. This may result, for example, in device 101 retaining its shape during thermal treating. However, as will be shown in greater detail later, this will not serve to reduce the problems encountered due to the tendency of laser light to be pattern dependent, and the resulting uneven heating resulting from varying topographies of a device. Specifically, uneven heating of the device and the problems associated with uneven heating may still result from laser annealing, even with the layer 112 formed on the device.

Figure 2A:
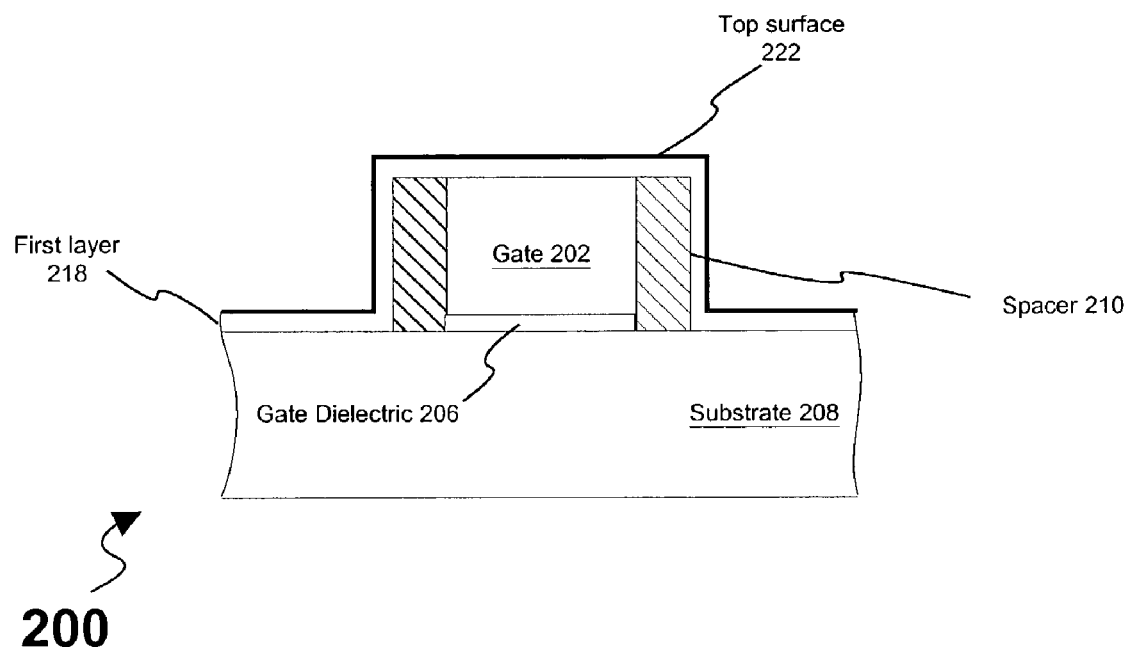
FIG. 2a is a illustration of a silicon substrate with devices formed thereon, wherein one or more devices has a first layer formed thereon.
Figure 2B:
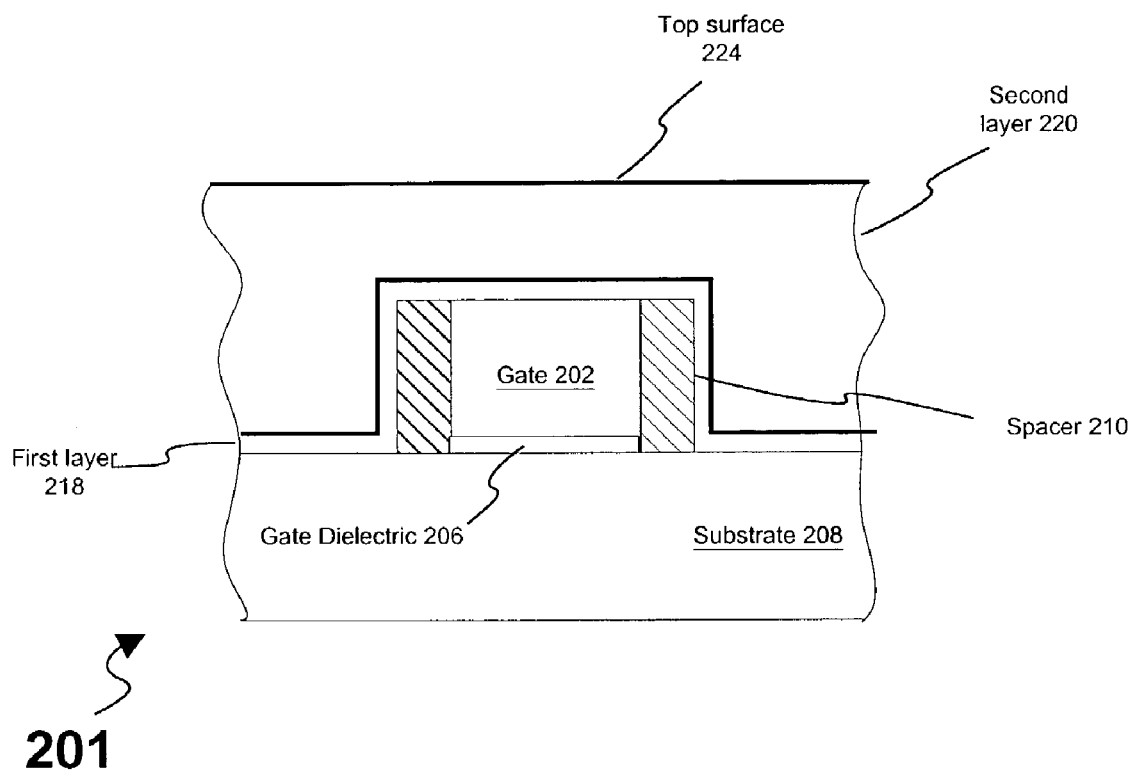
FIG. 2b is a illustration of a silicon substrate with devices formed thereon, wherein one or more devices have a first layer and a second layer formed thereon.

FIG. 2a and FIG. 2b illustrate utilization of one embodiment of a capping layer in accordance with the claimed subject matter. Shown in FIG. 2a is partially fabricated transistor 200, which may be structurally similar to partially formed transistor 100 of FIG. 1. Partially formed transistor 200 may be embodied on a silicon wafer (not shown). Partially formed transistor 200 may include a substrate 208, which may comprise silicon, for example. A gate dielectric 206 is typically formed on the substrate, and may comprise silicon dioxide or other dielectric material, for example. Gate 202 is typically formed on the gate dielectric. Gate 202 is formed from an electrically conductive material, such as a metal or polysilicon based material, for example. Spacers 210 may be formed on the sides of the gate 202 and gate dielectric 206, and may be formed from a dielectric material. A portion of the substrate 208 may be implanted with dopant (not shown). One or more heat treating processes may be utilized to activate the dopant. Formed on at least a portion of one or more surfaces of partially formed transistor 200 is a first layer 218.

First layer 218 may be comprised of one or more materials, or a combination of materials. In an embodiment, first layer 218 may include silicon dioxide ($SiO_2$). In another embodiment, first layer 218 may include silicon nitride ($Si_3N_4$). In another embodiment, first layer 218 may include a combination of silicon dioxide ($SiO_2$) and silicon nitride ($Si_3N_4$). It will, of course, be understood that the claimed subject matter is not limited in this respect, but may comprise any material capable of being deposited one or more surfaces of a device such as partially formed transistor 200, that exhibits desirable properties, such as a particular reflectivity, heat conduction, heat capacity or reactivity, as just a few examples. Additionally, first layer 218 may be formed by any number of methods, including chemical vapor deposition (CVD), one or more sputter processes, growing, or any number of other well known methods that may be incorporated for forming a layer such as first layer 218 on a surface, for example.

In one embodiment, first layer 218 is formed on a substantial amount of the exposed surfaces of partially formed transistor 200. The material comprising the first layer is selected based on a number of characteristics, which may include melting point, shape retention, or light absorption properties, and the ability to maintain mechanical and structural integrity during irradiation, for example. In this embodiment, first layer may comprise a silicon dioxide layer deposited by use of chemical vapor deposition, wherein the layer is deposited on a substantial portion of the exposed surfaces of partially formed transistor 200 to a thickness in the approximate range of 0.001 micron to 0.1 micron, for example, and may be formed to a substantially uniform thickness, for example, although the claimed subject matter is not so limited. A second layer may be subsequently formed on the top surface 222 of first layer 218, as described in more detail in reference to FIG. 2b.

Shown in FIG. 2b is partially fabricated transistor 201, which may be structurally similar to partially formed transistor 200 of FIG. 2a, but with a second layer 220 formed thereon. Partially formed transistor 201 may be embodied on a silicon wafer (not shown). Partially formed transistor 201 may include a substrate 208, which may comprise silicon, for example. A gate dielectric 206 is typically formed on the substrate, and may comprise silicon dioxide or other dielectric material, for example. Gate 202 is typically formed on the gate dielectric. Gate 202 is formed from an electrically conductive material, such as a metal or polysilicon based material, for example. Spacers 210 may be formed on the sides of the gate 202 and gate dielectric 206, and may be formed from a dielectric material. A portion of the substrate 208 may be implanted with dopant (not shown). One or more heat treating processes may be utilized to activate the dopant. Second layer 220 may be formed on at least a portion of the top surface 222 of first layer 218.

Second layer 220 may be comprised of one or more materials, or a combination of materials. In an embodiment, second layer 220 may include tungsten, titanium, tantalum, or one or more metal nitrides such as titanium nitride (TiN) or tantalum nitride (TaN), for example. It is important to note, however, that the claimed subject matter is not limited in this respect, but may comprise any material capable of being deposited one or more surfaces of a device such as partially formed transistor 201 that exhibits desirable properties, such as a particular reflectivity, heat conduction, heat capacity or reactivity, and the ability to be planarized, as just a few example. Additionally, second layer 220 may be formed by any number of methods, including chemical vapor deposition (CVD), one or more sputter processes, growing, or any number of other well known methods that may be incorporated for forming a layer such as first layer 220 on a surface.

In one embodiment, first layer 220 is formed on a substantial amount of the top surface 222 of first layer 218. The material comprising the first layer is selected based on a number of characteristics, which may include melting point, shape retention, or light absorption properties, and the ability to maintain mechanical and structural integrity during irradiation or planarization, for example. In this embodiment, second layer 220 may comprise a titanium layer deposited by use of chemical vapor deposition, wherein the layer is deposited on a substantial portion of the top surface 222 of first layer 218, and is formed to a thickness substantially greater than the thickness of first layer 218. For example, first layer may have an approximate thickness of 0.1 micron, and second layer may be formed on the first layer to an approximate thickness of 1 micron, although, of course, the claimed subject matter is not so limited. When formed, the top surface 224 of second layer 220 may be substantially planar, although the claimed subject matter is not so limited. For example, one or more processes may be performed on a substantial portion of the top surface 224 of second layer 220, resulting in top surface 224 being substantially planar.

In one embodiment, after forming second layer 220, one or more chemical mechanical processes may be used to substantially planarize the top surface 224 of second layer 220, such as mechanical polishing or a wet etch, for example. This may result in the top surface 224 of second layer 220 being substantially planar. In this particular embodiment, after undergoing one or more chemical mechanical processes such as mechanical polishing, surface 224 may be substantially planar, and partially formed transistor 201 may undergo one or more thermal treating processes such as laser annealing. As described previously, laser light may be pattern dependent, and variations in the topography of a surface being annealed may cause differing portions of the surface to absorb more heat than others, which may result in overheating or underheating of particular areas. However, when a substantially planar surface, such as the top surface 224 of second layer 220 undergoes a laser annealing process, there are no substantial variations in topography, and the device 201 may be capable of absorbing laser light substantially evenly. This may result in one or more portions of device 201 being subjected to even heating in a thermal treating process, and as a result, many undesirable characteristics of uneven heating described previously may be abated.

In one embodiment, it may be desirable to remove a portion of one or more layers formed on a device such as device 201 after one or more annealing processes. Removal may be by any number of methods, but it is envisioned that for the above-described first and second layers, a second layer 220 may be substantially removed prior to any removal of first layer 218. In one embodiment, second layer 220 may be comprised of a metal nitride (e.g. titanium nitride). In this embodiment, removal may be accomplished by incorporating a hydroxide or sulfuric acid/oxidant based chemistry that may etch at least a portion of second layer 220. However, it is important to note that removal is not limited to a wet etch process or to use of a hydroxide or a sulfuric acid/oxidant based chemistry, but any removal process that results in the removal of a substantial portion of the second layer 220 is in accordance with the claimed subject matter.

Removal of a substantial portion of the first layer 218 may be accomplished in a similar manner to that used in the removal of the second layer 220. For example, in one embodiment, first layer 218 may be comprised of silicon dioxide ($SiO_2$). In this embodiment, removal may be accomplished by incorporating a hydroxide- or sulfuric acid/oxidant based chemistry that may etch at least a portion of first layer 218. However, it is important to note that removal is not limited to a wet etch process or to use of a hydroxide or a sulfuric acid/oxidant based chemistry, but any removal process that results in the removal of a substantial portion of the first layer 218 is in accordance with the claimed subject matter.

It can be appreciated that the embodiments may be applied to the formation of any semiconductor device wherein annealing may be desirable. Certain features of the embodiments of the claimed subject matter have been illustrated as described herein, however, many modifications, substitutions, changes and equivalents will now occur to those skilled in the art. Additionally, while several functional blocks and relations between them have been described in detail, it is contemplated by those of skill in the art that several of the operations may be performed without the use of the others, or additional functions or relationships between functions may be established and still be in accordance with the claimed subject matter. It is, therefore, to be understood that the. appended claims are intended to cover all such modifications and changes as fall within the true spirit of the embodiments of the claimed subject matter.

What is claimed is:

1. A method of forming a semiconductor device, comprising:

forming one or more layers on at least a portion of the top surface of the semiconductor device;

planarizing one of the one or more layers, wherein said one of the one or more layers is a top conductive layer;

annealing at least a portion of the semiconductor device beneath a planarized top conductive layer that includes exposing the planarized top conductive layer to a laser light; and removing at least a portion of the one or more conductive layers, using one or more etching processes.

2. The method of claim 1, wherein the semiconductor device comprises a plurality of partially formed transistors.

3. The method of claim 1, wherein one or more layers comprises a silicon based layer, and one or more layers comprises a metal layer, the method further comprising removing at least a portion of metal layer, and subsequently removing at least a portion of the silicon based layer.

4. The method of claim 1, wherein said planarizing is performed by a chemical mechanical polishing process.

5. The method of claim 1, wherein at least one of said one or more layers comprises a metal layer.

6. The method of claim 5, wherein the metal layer comprises a titanium based layer formed to an approximate thickness of 0.1 to 1 microns.

7. The method of claim 1, wherein at least one of said one or more layers comprises a silicon based layer.

8. The method of claim 7, wherein said silicon based layer comprises a silicon dioxide layer formed to an approximate thickness of 0.001 to 0.01 microns.

9. The method of claim 1, wherein said one or more layers comprises a silicon based layer, and said one or more layers comprises a metal layer, the method further comprising depositing the silicon based layer on at least a portion of the exposed surface of the device, and subsequently depositing the metal layer on at least a portion of the top surface of the silicon based layer.

10. The method of claim 9, wherein the silicon based layer is deposited by chemical vapor deposition, and the metal layer is deposited by a sputter process.

11. The method of claim 1, wherein said removing comprises selective removing, wherein the selective removing comprises an etch that removes at least a portion of the one or more layers, selective to the top surface of the semiconductor device.

12. The method of claim 11, wherein selective removing comprises removing one or more sacrificial layers by using one or more chemicals selected based on the chemicals ability to remove one or more sacrificial layers without removal of other materials on the semiconductor device.

13. The method of claim 1, wherein said removing comprises a wet-etch.

14. The method of claim 13, wherein said wet etch comprises a hydroxide based wet etch.

15. The method of claim 13, wherein said wet etch comprises a sulfuric acid/oxidant based wet etch.

16. A method of annealing a silicon wafer, comprising:
   at least partially forming a transistor on a silicon wafer;
   forming a capping conductive layer on at least a portion of the top surface of the silicon wafer;
   planarizing the top surface of the capping conductive layer;
   after planarizing, exposing said top surface of a planarized capping conductive layer to a laser light to anneal at least a portion of the silicon wafer beneath said planarized capping conductive layer; and
   removing at least a portion of the capping conductive layer by use of at least one etching process.

17. The method of claim 16, wherein the capping conductive layer is comprised of a metal layer overlying a silicon based layer.

18. The method of claim 16, wherein the capping conductive layer is formed by at least one chemical vapor deposition process.

19. The method of claim 16, wherein the capping conductive layer is substantially thicker than the silicon wafer.

20. The method of claim 16, wherein said planarizing results from a chemical mechanical polishing.

21. The method of claim 16, wherein at least a portion of the capping conductive layer comprises titanium nitride (TiN).

22. The method of claim 16, further including
   forming an insulating layer on the at least a portion of the top surface of the silicon wafer before forming the capping conductive layer.

* * * * *